(12) United States Patent
Haws et al.

(10) Patent No.: US 7,039,569 B1
(45) Date of Patent: May 2, 2006

(54) AUTOMATIC ADAPTIVE DIMENSIONING FOR CAD SOFTWARE

(76) Inventors: Richard R. Haws, 59 Ontario Street, Alliston, Ontario (CA) L9R 1E3; Robert Nicolucci, 132 Richmond Street, Richmond Hill, Ontario (CA) L4C 3Y4

( * ) Notice: Subject to any disclaimer, the term of this patent is extended or adjusted under 35 U.S.C. 154(b) by 1006 days.

(21) Appl. No.: 09/589,758

(22) Filed: Jun. 9, 2000

(51) Int. Cl.
    *G06G 7/47* (2006.01)
(52) U.S. Cl. .................. 703/7; 703/1; 703/6; 707/102; 345/420; 345/427; 345/419
(58) Field of Classification Search .................. 703/1, 703/2, 22, 6, 7; 345/441, 442, 420; 707/102, 707/5
    See application file for complete search history.

(56) References Cited

U.S. PATENT DOCUMENTS

| | | | | |
|---|---|---|---|---|
| 5,297,241 A | * | 3/1994 | Hirr, Jr. et al. ............. | 345/427 |
| 5,390,294 A | * | 2/1995 | Takeuchi .................... | 345/441 |
| 5,625,827 A | * | 4/1997 | Krause et al. ............... | 715/502 |
| 5,701,403 A | * | 12/1997 | Watanabe et al. ........... | 345/419 |
| 5,729,750 A | * | 3/1998 | Ishida ........................ | 715/502 |
| 5,844,563 A | * | 12/1998 | Harada et al. ............. | 345/420 |
| 5,847,956 A | * | 12/1998 | Bronfeld et al. ............. | 700/98 |
| 5,990,897 A | * | 11/1999 | Hanratty ..................... | 345/420 |
| 5,999,186 A | * | 12/1999 | Jackson ....................... | 345/420 |
| 6,014,503 A | * | 1/2000 | Nagata et al. ................. | 703/1 |
| 6,037,945 A | * | 3/2000 | Loveland ..................... | 345/420 |
| 6,184,901 B1 | * | 2/2001 | Silva et al. .................. | 345/474 |
| 6,232,985 B1 | * | 5/2001 | Chase et al. ................. | 345/411 |
| 6,256,595 B1 | * | 7/2001 | Schwalb et al. ............... | 703/1 |
| 6,281,907 B1 | * | 8/2001 | Baumann ..................... | 345/660 |
| 6,445,388 B1 | * | 9/2002 | Subrahmanyam et al. .. | 345/420 |
| 6,771,260 B1 | * | 8/2004 | Hazama et al. ............. | 345/420 |

FOREIGN PATENT DOCUMENTS

| EP | 0 306 989 A2 * | 11/1989 |
|---|---|---|
| JP | 0 484 928 A2 * | 5/1992 |

OTHER PUBLICATIONS

"A Constraint-based Manipulator Toolset for Editing 3D Objects", C. Hsu, Solid Modeling 97', ACM Jul. 1997.*
"Parametric Design and its Impact of Solid Modeling Applicantions", R. Anderl, Solid Modeling 95', ACM Jul. 1995.*
"A Constraint-based Manipulator Toolset for Editing 3D Objects", C. Hsu, Solid Modeling 97', ACM Jul. 1997.*

(Continued)

*Primary Examiner*—Jean R. Homere
*Assistant Examiner*—Fred Ferris
(74) *Attorney, Agent, or Firm*—Bereskin & Parr

(57) ABSTRACT

An automatic adaptive dimensioning program for CAD software in which dimension annotations are created by the CAD program automatically as an object is drawn and automatically associated with the object. Thereafter, changing the length of the object automatically changes the associated dimension annotation, or alternatively, changing the associated dimension annotation automatically changes the length of the object. When another object is interposed into or superposed onto an intermediate position of the existing object, the automatic adaptive dimensioning annotation feature of the invention automatically creates dimension annotations corresponding to the position of the new object relative to the existing object. The new object can be automatically positioned in relation to the existing object by specifying interposition dimensions or segment lengths in the dimension annotations.

11 Claims, 11 Drawing Sheets

OTHER PUBLICATIONS

"Parametric Design and its Impact of Solid Modeling Applicantions", R. Anderl, Solid Modeling 95', ACM Jul. 1995.*

ArchiTECH.PC v 3.0 joins the object revolution H.E. Goldberg, CADALYST, Advanstar publications, May 2000.*

"Automatic Dimensioning in Design for Manufacturing", D. Serrano, ACM 089791-427-9/91/0006/0379, ACM 1991.*

SolidView/Pro, Solid Concepts Inc. Sep. 1999.*

"Single Dimension Relationships in Relational CAD", J. Hanna, Fifth Symposium of solid Modeling, ACM May 1999.*

Autodesk, Inc. AutoCAD User's Guide, Release 14, Dec. 5, 1997.

"Dimensioning in Revit". p. 1-6, Revit website, Sep. 5, 2000.

Bricsnet website, Oct. 11, 2000.

Softplan Systems, Inc., "Exercies 9.7 Special Features", *Learning SoftPlan v.7.0.0*, © 1985-1994, pp. 9-15 to 9-18.

Softplan Systems, Inc., "Exercies 12.0 Adding Dimensions", *Learning SoftPlan v.7.0.0*, © 1985-1994, p. 12-1.

Softplan Systems, Inc., "Exercies 12.1 Setting Dimension Options" *Learning SoftPlan v.7.0.0*, © 1985-1994, pp. 12-2 to 12-9.

Softplan Systems, Inc., "Exercies 12.2 Dimensioning The Interior Of A Floorplan" *Learning SoftPlan v.7.0.0.*, © 1985-1994, pp. 12-10 to 12-14.

Softplan Systems, Inc., "Exercies 16.2 Editing Dimension", *Learning SoftPlan v.7.0.0.*, © 1985-1994, pp. 16-34 to 16-35.

Softplan Systems, Inc., "Exercies 1.3 Changing Dimension Options" *Configuring SoftPlan , v.7.0.0.*, © 1985-1994, pp. 1-43 to 1-56.

Softplan Systems, Inc. "Exercies 1.11 Setting Structural Dimension" *Configuring SoftPlan , v.7.0.0.*, © 1985-1994, pp. 1-107 to 1-110.

* cited by examiner

AUTOMATIC ADAPTIVE DIMENSIONING FOR CAD SOFTWARE

FIELD OF THE INVENTION

This invention relates to computer software. In particular, this invention relates to an improvement in computer aided design (CAD) software.

BACKGROUND OF THE INVENTION

There are many types of computer aided design (CAD) software which assist in architectural design and drafting. Such software is widely used, as it considerably simplifies the task of drafting plans to scale with such annotations as are required for the needs of the user.

One of the advantages of CAD software is a feature whereby an object can have dimension annotations associated with the object, including dimension lines, extension lines, symbols of termination (e.g. arrowheads, architectural ticks) and dimension text, created automatically. Thus, the dimension can be automatically created for an object as the object is drawn. This considerably simplifies the annotation of the drawing, which had previously had been a very time consuming process.

Some CAD programs allow manual associative dimensioning, by which a dimension annotation can be manually associated with an object, and thereafter if the object is moved the dimension annotation adjusts automatically with the object. This also facilitates the annotation of drawings, however it requires that the user manually attach the dimension to the object in order for changes in the object to be reflected in the associated dimension annotation. Furthermore, if the object is broken, for example if another object is interposed in or superposed onto an intermediate point of the existing object, the associative dimensioning cannot accommodate the new object and new dimensions, so new dimension annotations corresponding to the new object must be manually added and new associations must be established between the existing dimension annotation and the remaining portions of the existing object. This is a time consuming process, particularly during the modification stages of CAD drafting.

For example, adding a window to an existing wall in a CAD drawing requires that the window be inserted at the intended position, that the existing dimension annotations be deleted and that new extension lines, dimension lines, termination symbols and dimension text be created to reflect the new segmentation of the object and/or the addition of any new object (or the removal of an existing object).

It would accordingly be advantageous if dimension annotations were created automatically as objects are created, and automatically associated with the objects as they are created. It would further be advantageous if dimension annotations would change automatically to accommodate any change to the existing objects, such as a new object inserted into a selected position relative to the existing objects or the deletion of an object from a group of objects.

SUMMARY OF THE INVENTION

The present invention overcomes these disadvantages by providing automatic adaptive dimensioning in a CAD software program. According to the invention, dimension annotations are created by the CAD program automatically as an object is drawn and automatically associated with the target object. Thereafter, changing the length of the target object automatically changes the associated dimension annotation, or alternatively, changing the associated dimension annotation automatically changes the length of the target object. Further, changing the dimension annotation associated with an adjacent object automatically changes the position of the target object.

Moreover, when another object is inserted into an intermediate position of an existing object, the automatic adaptive dimensioning feature of the invention automatically creates dimension annotations corresponding to the position of the new object relative to the existing object; likewise, the new object can be automatically positioned in relation to the existing object by specifying interposition dimensions or segment lengths in the existing dimension annotations. Thereafter, any changes to the lengths or relative positions of the objects will automatically change the associated dimension annotations, and any changes made to the associated dimension annotations will automatically change the lengths and/or relative positions of the objects.

Incorporating the automatic adaptive dimensioning feature of the invention into a CAD program accordingly substantially decreases the production time of architectural drawings. The commensurate savings in labour, particularly in the input, documentation and modification stages of drawing preparation, provides a considerable advantage over conventional CAD drawing programs.

These and other features of the invention will be apparent from the detailed description which follows.

The present invention thus provides a method of annotating a computer aided design drawing, comprising the steps of a. setting parameters of dimension annotations comprising one or more of dimension text, dimension lines, extension lines and termination symbols, b. creating a target object by selecting a length of the target object; and c. automatically generating dimension annotations corresponding to the target object, whereby the dimension annotations are associated with the target object such that in response to a modification of a length or relative position of the target object, the dimension annotations associated with the target object or the dimension annotation associated with at least one adjacent object, or both, are automatically adjusted to correspond to the modification of the length or relative position of the target object.

The present invention further provides a computer program product for use with a computer, the computer program product comprising a computer usable medium having computer readable program code means embodied in said medium for annotating a computer aided design drawing, said computer program product having computer readable program code means for setting parameters of dimension annotations comprising one or more of dimension text, dimension lines, extension lines and termination symbols, computer readable program code means for creating a target object by selecting a length of the target object; and computer readable program code means for automatically generating dimension annotations corresponding to the target object, whereby the dimension annotations are associated with the target object such that in response to a modification of a length or relative position of the target object, the dimension annotations associated with the target object or the dimension annotation associated with at least one adjacent object, or both, are automatically adjusted to correspond to the modification of the length or relative position of the target object.

The present invention further provides a program storage device readable by a machine, tangibly embodying a program of instructions executable by the machine to perform method steps for annotating a computer aided design drawing, said method steps comprising: a. setting parameters of dimension annotations comprising one or more of dimension text, dimension lines, extension lines and termination symbols, b. creating a target object by selecting a length of the target object; and c. automatically generating dimension annotations corresponding to the target object, whereby the dimension annotations are associated with the target object such that in response to a modification of a length or relative position of the target object, the dimension annotations associated with the target object or the dimension annotation associated with at least one adjacent object, or both, are automatically adjusted to correspond to the modification of the length or relative position of the target object.

A further aspect of the invention includes the step of, in response to a modification of the dimension annotation associated with the target object or the dimension annotation associated with at least one adjacent object or both, automatically modifying a length or relative position of the target object to correspond to the modification of the dimension annotation.

BRIEF DESCRIPTION OF THE DRAWINGS

In drawings which illustrate by way of example only a preferred embodiment of the invention.

DETAILED DESCRIPTION OF THE INVENTION

Figure 1:
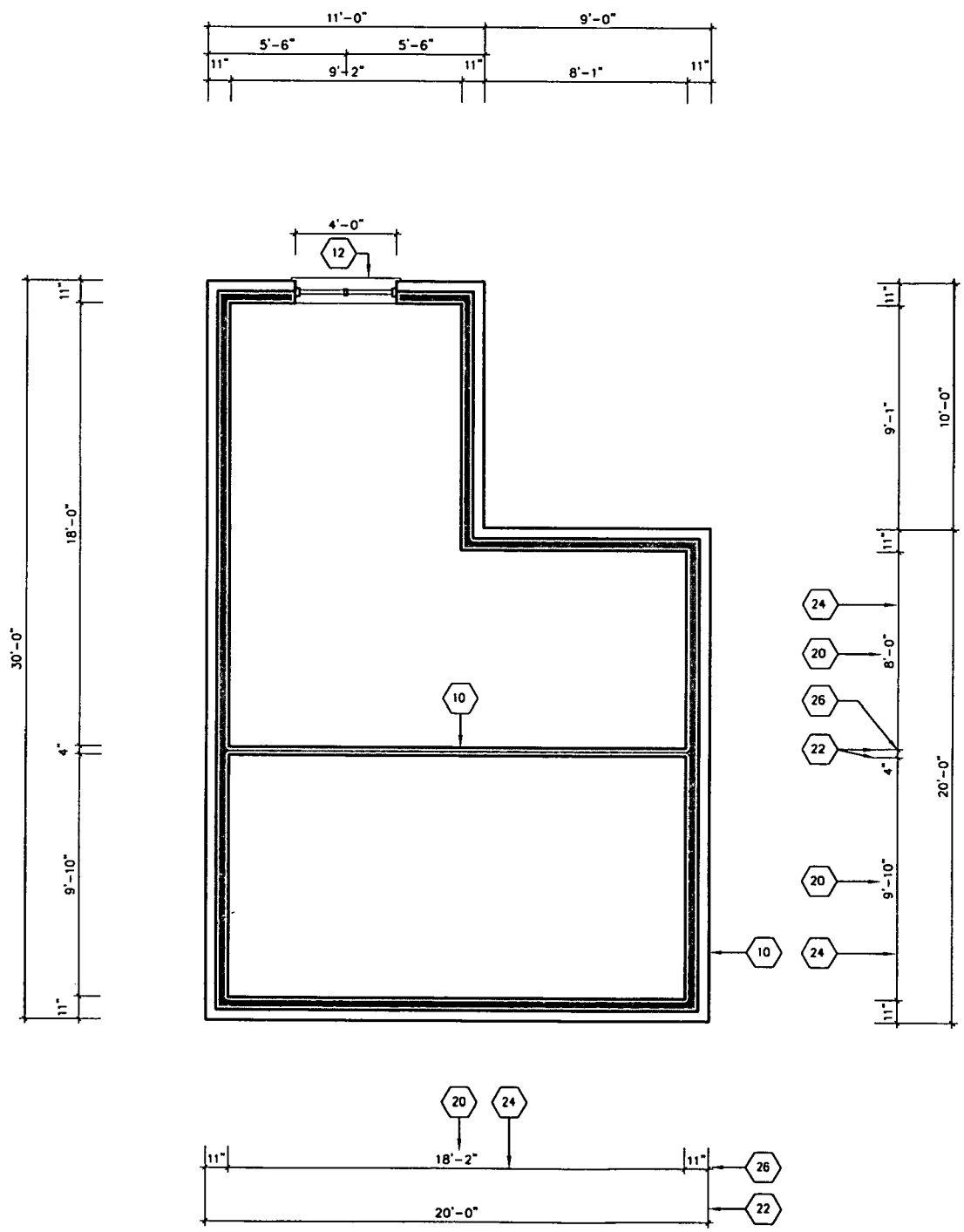
FIG. 1 is a diagrammatic illustration of objects and associated dimension annotations in a conventional CAD drawing.

FIG. 1 illustrates an architectural drawing by way of example. In a conventional CAD drawing program, line objects representing walls 10 and a windows 12 which are drawn or inserted in the CAD environment. Dimension text 20 specifying the lengths and relative positions of the objects 10, 12 are entered by the user, and in some CAD programs may be thereafter manually associated with each respective object 10, 12, so that a change in the length of the object is automatically reflected in the associated dimension text 20. Extension lines 22 are positioned or picked (selected) by the user for the desired dimension text, and dimension lines 24 and termination symbols 26 such as architectural ticks are either manually created by the user, or generated based on user-defined settings, based on the selected positions of the extension lines 22.

According to the invention, the dimension annotations are automatically created and associated with the respective objects to which they relate, and thereafter these dimension annotations are adaptive. Thus, the interposition or superposition of a new object in or onto an existing object automatically results in new extension lines 22 at the extremities of the new object, parsing of the existing dimension line 24 into segments with selected termination symbols 26, and the repositioning and recalculation of dimension text to accommodate the new object.

In use, to create a horizontal or vertical dimension associated with an object 10, 12, the object dimension text 20 can be selected by clicking, picking or otherwise specifying first and second points representing the ends of the object 10 or 12. In the case of multiple dimension strings, the locations of the dimension lines 24 (for example baseline strings or aligned strings) are also specified by the initial user settings, as are extension lines 22 and dimension text 20, with the selected termination symbols 26, which are thereafter generated automatically by the adaptive dimensioning feature of the invention based on the coordinate positions selected for the object. This feature of the invention also automatically trims or extends the dimensions annotations in response to a change in the size or position of the associated target object.

Thereafter, modifications to the existing objects 10, 12, may be made in two ways:

1. By modifying the length of the target object 8 itself and/or moving the target object to a new position relative to other objects. In this situation the associated dimension annotations automatically change to adapt to the modification of the associated object's dimension and/or position, moving extension lines, arrowheads or other termination symbols, and dimension text as necessary to accommodate the modification.

2. By changing dimension text to specify a new length for the target object 8, and/or changing the dimension text of an adjacent object to reposition the target object. In this case, the length of the object whose associated dimension text has been modified changes to correspond to the modified dimension. If the length of an adjacent object is changed, the target object is repositioned to remain adjacent to the adjacent object.

Specifics of the extension lines 22, alignment of dimension lines 24 (e.g. as aligned or baseline), type of termination symbols (e.g. architectural ticks), size and placement of dimension text 20, and any other desired parameters, are selected as setup parameters by the user before commencing drawing. The CAD drawing will automatically adaptively associate dimension annotations having the predefined parameters with the respective objects as they are inserted, deleted or modified.

Figure 2:
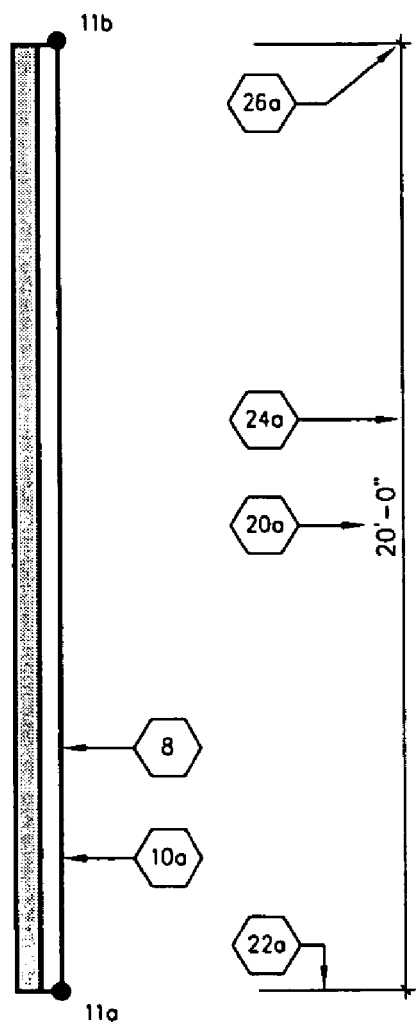
FIG. 2 is a diagrammatic illustration of an object and associated dimension annotations in a CAD drawing using the method of the invention.

Thus, in the example shown as a series of drawing steps in FIGS. 2 to 11, a target object 8, in FIG. 2 being a wall 10a, is inserted into a new CAD drawing by selecting points 11a and 11b. Dimension annotations are automatically created by the method and computer program of the invention, by creating extension lines 22a aligned with the extremities of the target object 10a, creating a dimension line 24a with termination symbols 26a at its ends and creating dimension text 20a adjacent to the dimension line 24a (or as otherwise specified by the user in the setup parameters).

Figure 3:
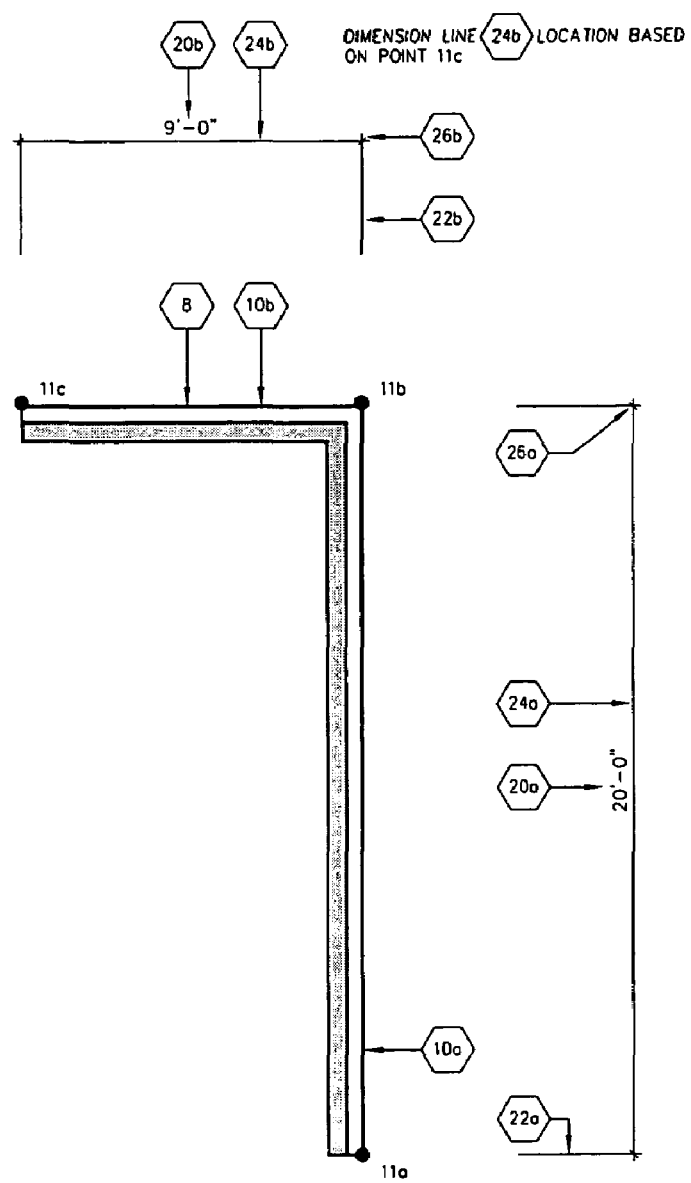
FIG. 3 is a diagrammatic illustration of the drawing of FIG. 2 after inserting a new object.
Figure 4:
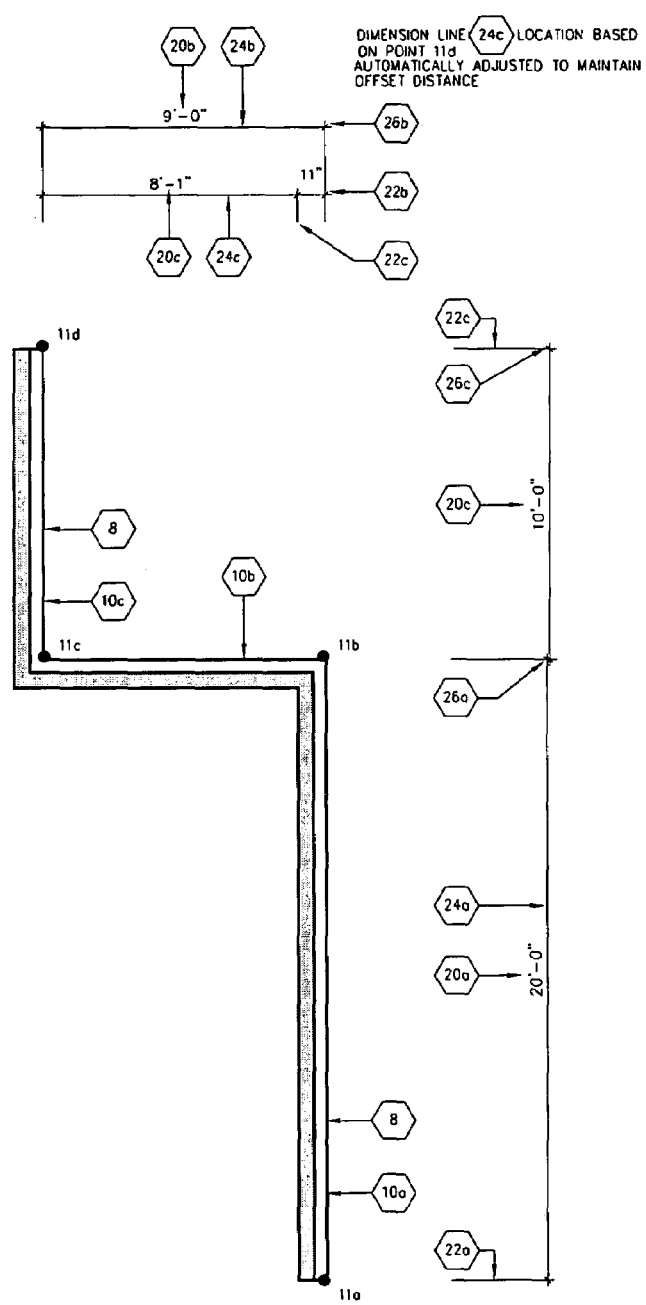
FIG. 4 is a diagrammatic illustration of the drawing of FIG. 3 after inserting a new object.

In FIG. 3 the target object 8 is a new exterior wall 10b, added to the drawing of FIG. 2 by selecting point 11c. Again dimension annotations are automatically created for the target object by aligning extension lines 22b with the extremities of the target object 8, creating a dimension line 24b with termination symbols 26b at its ends and creating dimension text 20b adjacent to the dimension line 24b. When a new target object 8 is created, for example another exterior wall 10c, by selecting point 11d, as shown in FIG. 4, in addition to automatically creating dimension annotations for the new exterior wall 10c, the position of the dimension annotations for the previous object are automatically shifted to accommodate the new target object 8.

Figure 5:
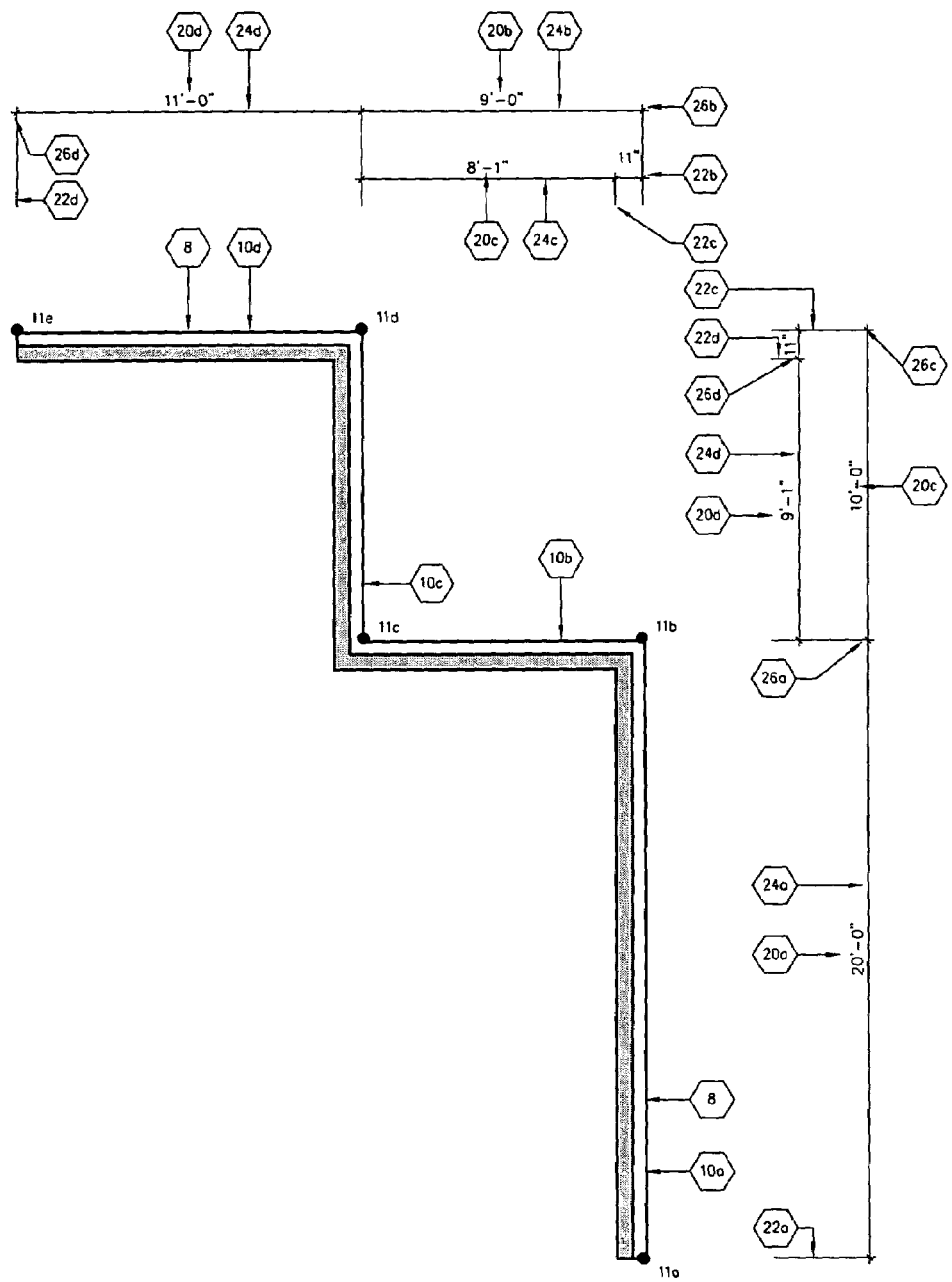
FIG. 5 is a diagrammatic illustration of the drawing of FIG. 4 after inserting a new object.
Figure 6:
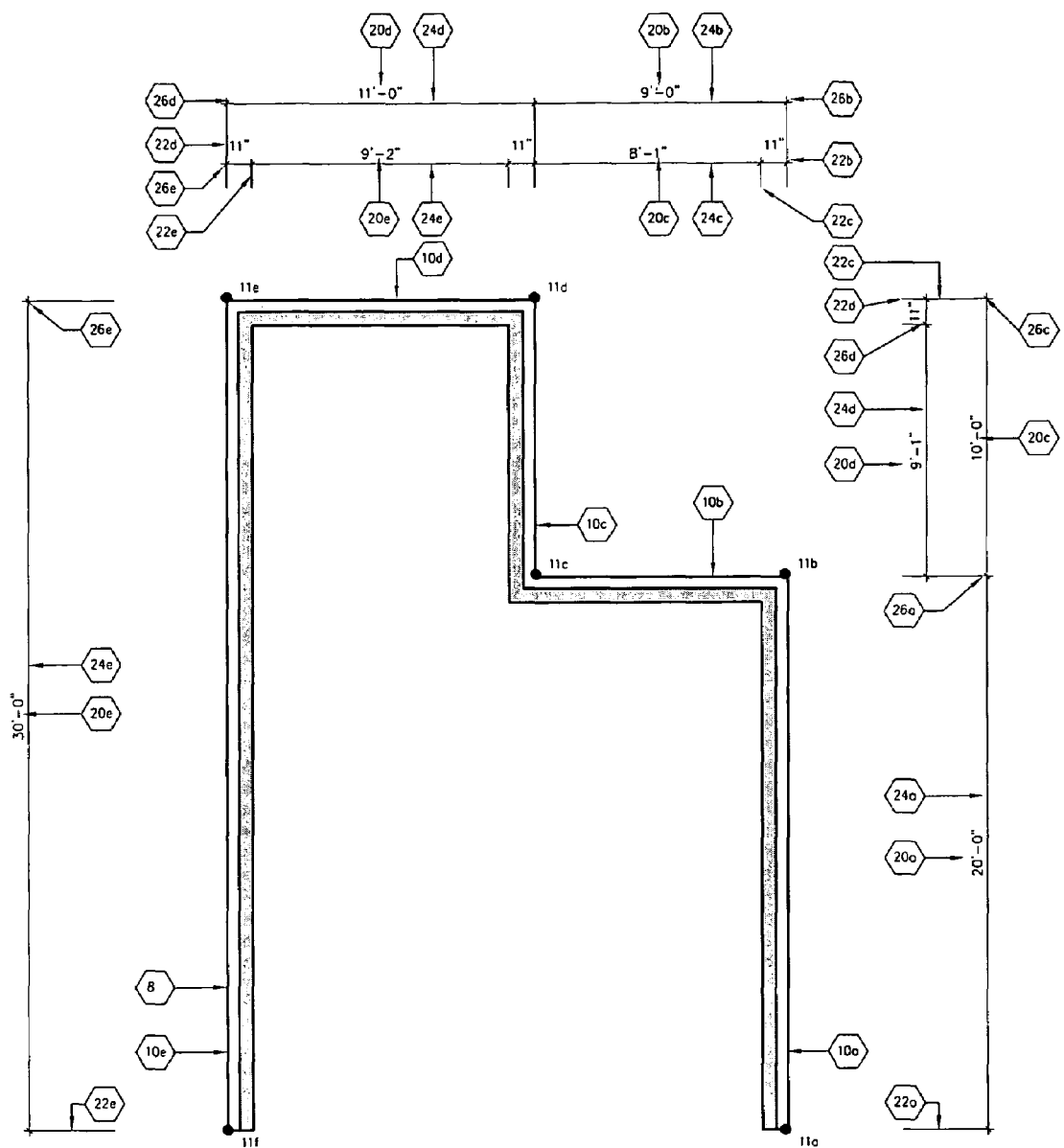
FIG. 6 is a diagrammatic illustration of the drawing of FIG. 5 after inserting a new object.
Figure 7:
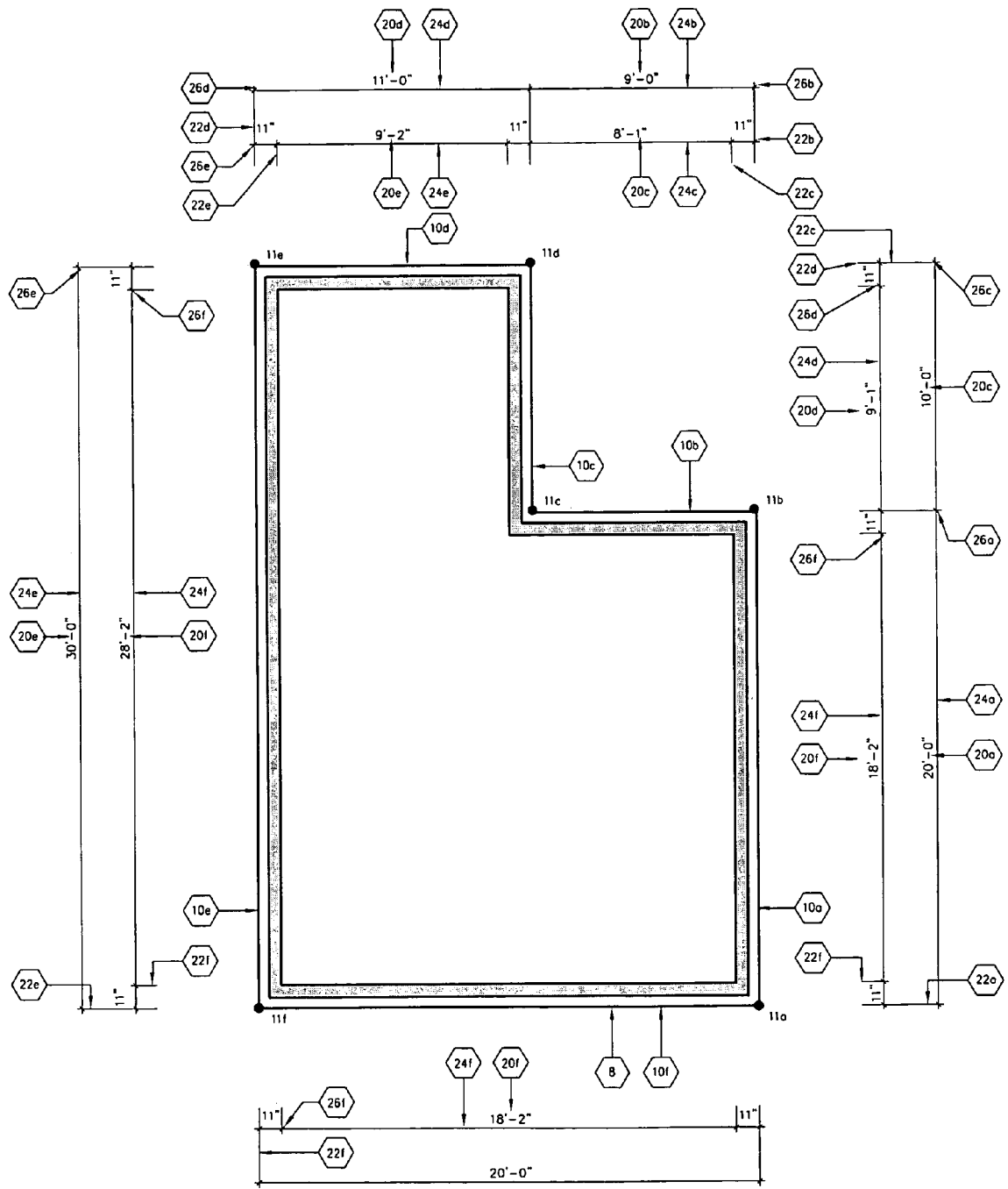
FIG. 7 is a diagrammatic illustration of the drawing of FIG. 6 after inserting a new object.

FIGS. 5, 6 and 7 each add a further target object 8, in each case an exterior wall 10d, 10e and 10f, by the selection of points 11e, 11f and 11a, respectively, to delimit the exterior of the structure, and in each case dimension annotations are automatically created for each target object 8 as the target object 8 is inserted, by creating extension lines 22d, 22e, 22f aligned with the extremities of the walls 10d, 10e and 10f, creating dimension lines 24d, 24e, 24f with termination symbols 26d, 26e, 26f at their respective ends and creating dimension text 20d, 20e, 20f adjacent to the respective dimension lines 24d, 24e, 24f.

Figure 8:
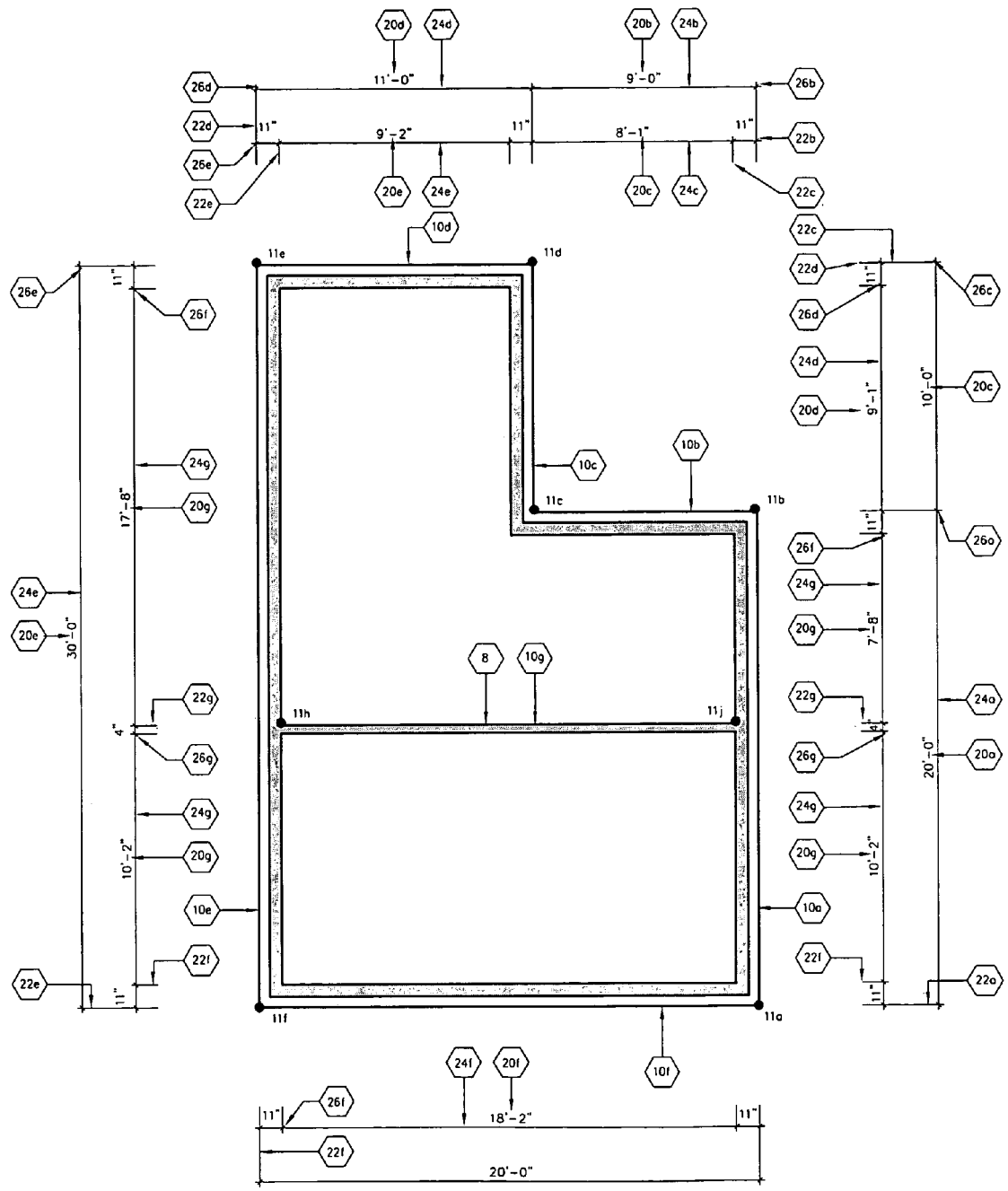
FIG. 8 is a diagrammatic illustration of the drawing of FIG. 7 after inserting a new object.
Figure 9:
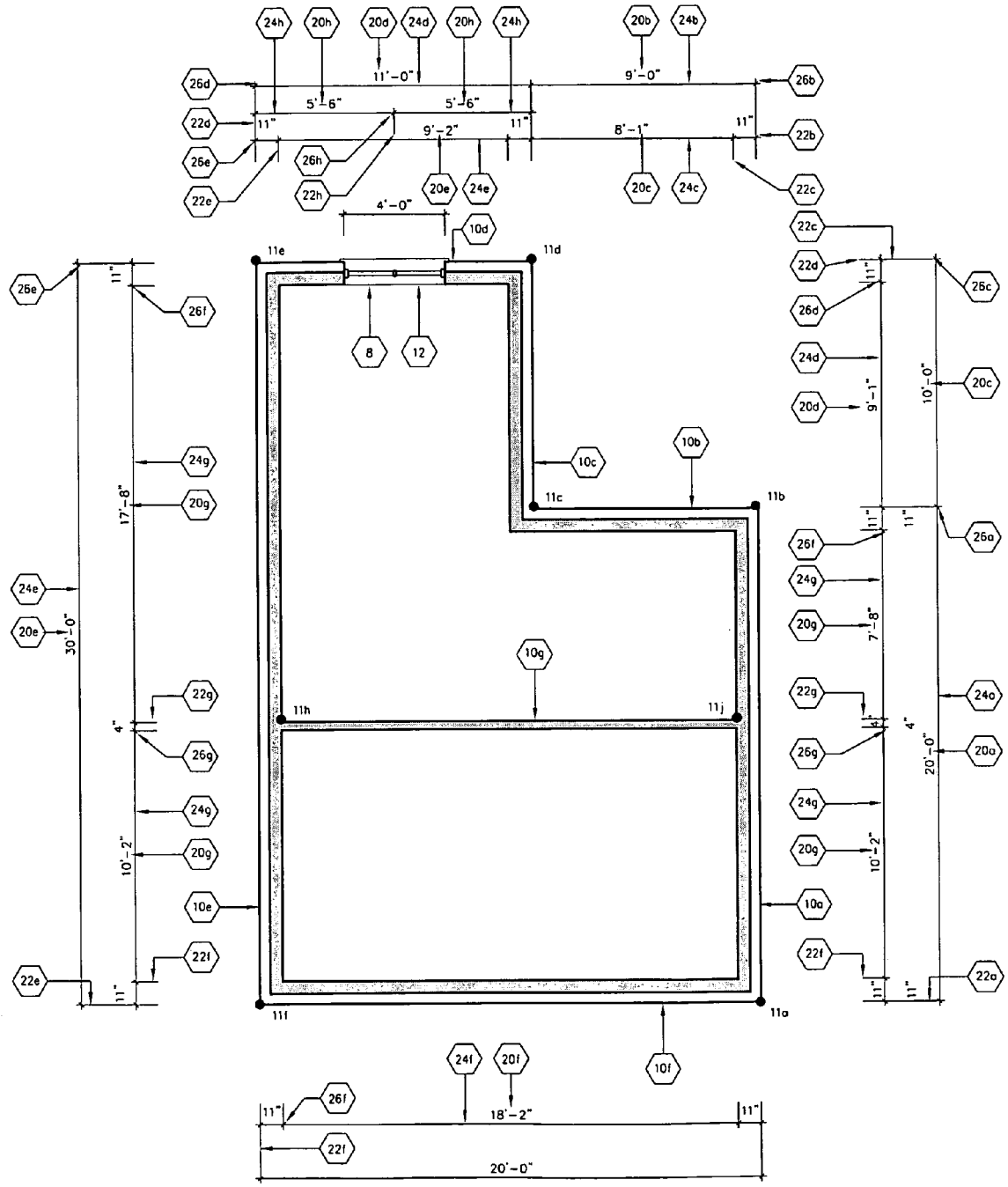
FIG. 9 is a diagrammatic illustration of the drawing of FIG. 8 after inserting a new object.

In FIG. 8 a target object 8 comprising a partition wall 10g is added to the drawing of FIG. 7 by selecting points 11h and 11j. In this case the adaptive feature of the invention automatically creates extension lines 22g at the appropriate points on the existing dimension lines 24a, 24f, parses the existing dimension lines 24a, 24f into segments 24g, and deletes the existing dimension text 20a, 20f and replaces it with new dimension text 20g relating to the newly created dimension line segments 24g. Similarly, when a target object 8 comprising a window 12 is added in FIG. 9, the adaptive dimensioning feature of the invention automatically creates a new dimension line 24h (as specified by the user in the setup parameters) at the window 12 having an on-center extension line 22h with associated dimension text 20h and termination symbols 26h.

Figure 10:
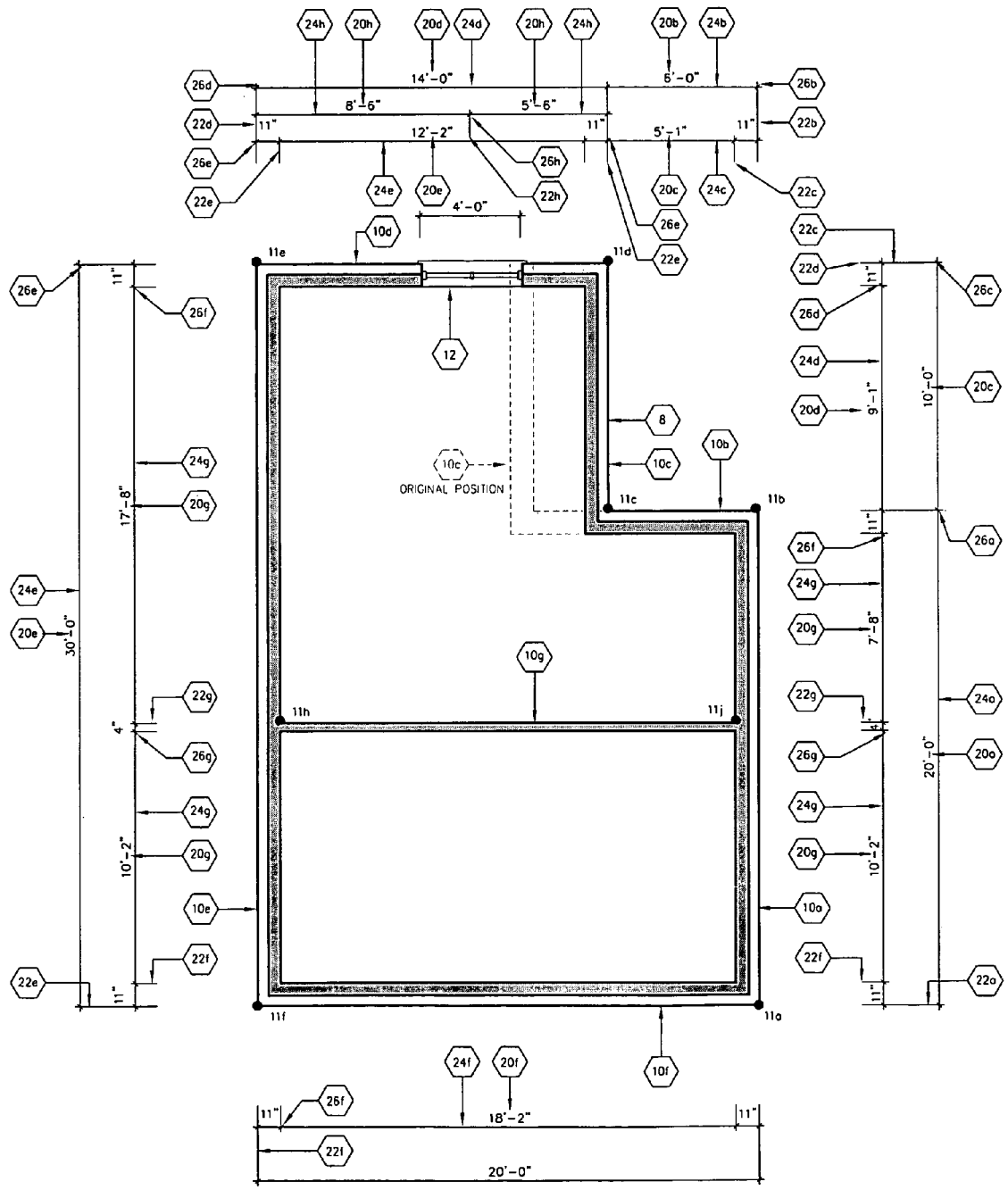
FIG. 10 is a diagrammatic illustration of the drawing of FIG. 9 after moving an existing object.

In FIG. 10, the target object 8 is wall 10c adjacent to the wall 10d with the window 12. Wall 10c is repositioned by dragging the wall 10c to a new position from the previous position (shown in phantom lines). The automatic adaptive dimensioning feature of the invention automatically moves all associated extension lines 22b, 22d to align with the repositioned wall 10c, and replaces the existing dimension text 20b, 22d of the resized walls 10b, 10d with new dimension text 20b, 20d reflecting the new position of the wall 10c relative to adjacent objects. The lengths of walls 10b, 10d adjacent to the target object 8 (wall 10c) automatically adjust to the new position of wall 10c.

Figure 11:
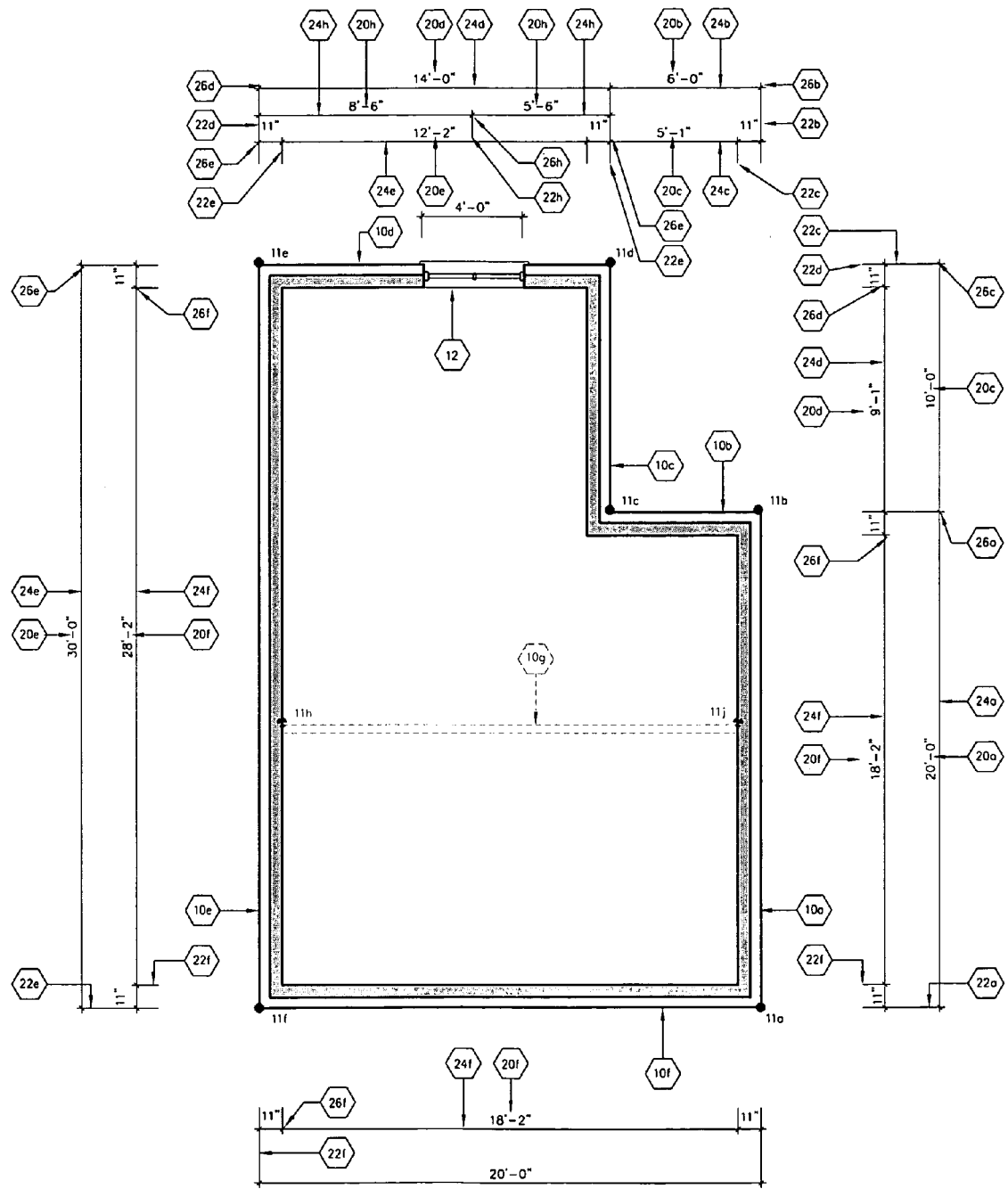
FIG. 11 is a diagrammatic illustration of the drawing of FIG. 10 after deleting an object.

To complete the drawing, in FIG. 11 the partition wall 10g (shown in phantom lines) has been deleted. The automatic adaptive dimensioning feature of the invention deletes the extension lines 22 previously associated with the partition 10g to reconstitute the original dimension lines 24f, deletes the dimension text 20g of the parsed dimension line segments 24g, and restores the original dimension text 24f (from FIG. 7).

Thus, the invention provides an automatic adaptive dimensioning feature in a CAD program which automatically creates and associates dimension annotations as an object is inserted into a drawing, and modifies the dimension annotations as an object is added, deleted or modified in the drawing. The invention thus provides a method of creating and modifying a CAD drawing which considerably simplifies the CAD documentation process.

The automatic adaptive dimensioning feature of the invention can be programmed into CAD software, or can be created as an independent program loaded as a "plug-in" for existing CAD software.

A preferred embodiment of the present invention having been thus described by way of example, variations and modifications will be apparent to those skilled in the art. The invention includes all such variations and modifications as fall within the scope of the appended claims.

What is claimed is:

1. A method for creating a computer aided design drawing formed of a plurality of target objects, comprising the steps of:
    (a) inputting first coordinate position data;
    (b) displaying a first target object corresponding to the first coordinate position data;
    (c) creating first dimension annotation data correlated to the first coordinate position data;
    (d) displaying a first dimension annotation correlated to the first dimension annotation data; and
    (e) cross-associating the first target object with the first dimension annotation, wherein as a result of such cross-association:
        (i) a change in the first coordinate position data will effect a correlated change in the first dimension annotation data; and
        (ii) a change in the first dimension annotation data will effect a correlated change in the further coordinate position data.

2. The method of claim 1, further comprising the steps of:
    (k) determining if the at least one further target object intersects the first target object
    (l) wherein if the at least one further target object intersects the first target object into a first segment and a second segment:
        (i) calculating first segment coordinate position data;
        (ii) calculating second segment coordinate position data;
        (iii) creating first segment dimension annotation data correlated to the first segment coordinate position data;
        (iv) displaying a first segment dimension annotation correlated to the first segment annotation data;
        (v) creating second segment dimension annotation data correlated to the second segment coordinate position data;
        (vi) displaying a second segment dimension annotation correlated to the second segment annotation data;
        (vii) cross-associating the first segment with the first segment dimension annotation; and
        (viii) cross-associating the second segment with the second segment dimension annotation.

3. The method of claim 1, further comprising the steps of:
    (m) determining if the at least one further target object is adjacent to any other target object.

4. The method of claim 3, further comprising the steps of:
    (n) inputting modifications to the further coordinate position data;
    (o) displaying the further target object in accordance with the modified further coordinate position data;
    (p) creating modified further dimension annotation data correlated to the modified further coordinate position data; and
    (q) displaying a modified further dimension annotation correlated to the further dimension annotation data.

5. The method of claim 4, further comprising the steps of:
(r) if the at least one further target object is adjacent to the first target object:
  (i) modifying the first coordinate position data in correlation to the modified further coordinate position data;
  (ii) displaying the first target object in accordance with the modified first coordinate position data;
  (iii) modifying the first dimension annotation data correlated to the modified first coordinate position data;
  (iv) displaying a first dimension annotation correlated to the modified first dimension annotation data.

6. A method for creating a computer aided design drawing formed of a plurality of target objects, comprising the steps of:
(a) inputting coordinate position data for a new target object;
(b) displaying the new target object corresponding to the coordinate position data;
(c) creating dimension annotation data correlated to the coordinate position data;
(d) displaying a dimension annotation correlated to the dimension annotation data;
(e) cross-associating the new target object with the dimension annotation, wherein in said cross-association:
  (i) a change in the coordinate position data will effect a correlated change in the dimension annotation data; and
  (ii) a change in the dimension annotation data will effect a correlated change in the coordinate position data;
(f) repeating steps (a) through (e) for at least one additional target object;
(g) wherein all of steps (a) through (e) are completed for one target object prior to inputting coordinate position data for any additional target object.

7. The method of claim 6, wherein step (a) further comprises the steps of:
(h) determining whether the new target object intersects any other target object; and
(i) wherein if the new target object intersects at least one other target object so as to create a first segment and a second segment:
  (i) calculating first segment coordinate position data,
  (ii) calculating second segment coordinate position data,
  (iii) creating first segment dimension annotation data correlated to the first segment coordinate position data,
  (iv) displaying a first segment dimension annotation correlated to the first segment annotation data,
  (v) creating second segment dimension annotation data correlated to the second segment coordinate position data,
  (vi) displaying a second segment dimension annotation correlated to the second segment annotation data,
  (vii) cross-associating the first segment with the first segment dimension annotation, and
  (viii) cross-associating the second segment with the second segment dimension annotation.

8. The method of claim 6, further comprising the step of:
(j) determining if the new target object is adjacent to any other target object.

9. The method of claim 8, further comprising the steps of:
(k) selecting a target object;
(l) inputting modified coordinate position data for the selected target object;
(m) displaying the selected target object in accordance with the modified coordinate position data;
(n) modifying the dimension annotation data corresponding to the selected target object, the modification correlated to the modified coordinate position data; and
(o) displaying a modified dimension annotation correlated to the modified dimension annotation data.

10. The method of claim 9, further comprising the steps of:
(p) if the selected target object is adjacent to at least one other adjacent target object:
  (i) adjusting the coordinate position data corresponding to the adjacent target object, wherein the adjustment is correlated to the modified coordinate position data;
  (ii) displaying the adjacent target object in accordance with the adjusted coordinate position data;
  (iii) adjusting the dimension annotation data corresponding to the adjacent target object, wherein the adjustment is correlated to the adjusted coordinate position data; and
  (iv) displaying a dimension annotation correlated to the adjusted dimension annotation data.

11. The method of claim 6, wherein step (a) further comprises the steps of:
(q) determining whether the new target object superposes any other underlying target object; and
(r) wherein if the new target object superposes an underlying target object:
  (i) creating at least one on-center dimension annotation data correlated to both the coordinate position data of the new target object and the coordinate position data of the underlying target object,
  (ii) displaying an on-center dimension annotation correlated to the on-center annotation data,
  (iii) cross-associating the new target object with the on-center dimension annotation, and
  (iv) cross-associating the underlying target object with the on-center dimension annotation.

* * * * *

UNITED STATES PATENT AND TRADEMARK OFFICE
CERTIFICATE OF CORRECTION

| | | |
|---|---|---|
| PATENT NO. | : 7,039,569 B1 | Page 1 of 1 |
| APPLICATION NO. | : 09/589758 | |
| DATED | : May 2, 2006 | |
| INVENTOR(S) | : Richard R. Haws et al. | |

It is certified that error appears in the above-identified patent and that said Letters Patent is hereby corrected as shown below:

column 6, line 29, replace - - further - - with "first"

column 6, line 30, replace - - position data. - - with the following:

"   position data;

(f) subsequent to step (e), inputting further coordinate position data corresponding to at least one further target object;

(g) displaying the further target object in accordance with the further coordinate position data;

(h) creating further dimension annotation data correlated to the further coordinate position data;

(i) displaying a further dimension annotation correlated to the further dimension annotation data (j) cross-associating the at least one further target object with the further dimension annotation, wherein as a result of such cross-association:

(i) a change in the further coordinate position data will effect a correlated change in the further dimension annotation data; and (ii) a change in the further dimension annotation data will effect a correlated change in the further coordinate position data. "

Signed and Sealed this

Twenty-ninth Day of August, 2006

JON W. DUDAS
*Director of the United States Patent and Trademark Office*